United States Patent
Kawano et al.

(10) Patent No.: US 8,508,299 B2
(45) Date of Patent: Aug. 13, 2013

(54) HIGH-FREQUENCY POWER AMPLIFIER

(75) Inventors: Takayuki Kawano, Kanagawa (JP); Kenta Seki, Kanagawa (JP); Satoshi Sakurai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/398,893

(22) Filed: Feb. 17, 2012

(65) Prior Publication Data

US 2012/0229217 A1    Sep. 13, 2012

(30) Foreign Application Priority Data

Mar. 10, 2011    (JP) .................................. 2011-052994

(51) Int. Cl.
*H03F 3/68*    (2006.01)

(52) U.S. Cl.
USPC .............................. 330/295; 330/51; 330/302

(58) Field of Classification Search
USPC .................. 330/51, 124 R, 295, 302
See application file for complete search history.

(56) References Cited

U.S. PATENT DOCUMENTS

| | | | |
|---|---|---|---|
| 6,674,323 B2 * | 1/2004 | Kagaya et al. ................. | 330/295 |
| 7,295,074 B2 * | 11/2007 | Wong et al. .................... | 330/295 |
| 7,408,405 B2 | 8/2008 | Ohnishi et al. | |
| 7,612,607 B2 * | 11/2009 | Harima ....................... | 330/124 R |
| 7,714,647 B2 * | 5/2010 | Jeon et al. .................. | 330/124 R |
| 2004/0113698 A1 * | 6/2004 | Kim et al. ..................... | 330/295 |
| 2009/0309656 A1 | 12/2009 | Jeon et al. | |
| 2010/0327969 A1 * | 12/2010 | Jung et al. ................. | 330/124 R |

FOREIGN PATENT DOCUMENTS

| | | |
|---|---|---|
| JP | 2002-271146 A | 9/2002 |
| JP | 2003-008706 A | 1/2003 |
| JP | 2003-087059 A | 3/2003 |
| JP | 2006-093773 A | 4/2006 |

\* cited by examiner

*Primary Examiner* — Khanh V Nguyen
(74) *Attorney, Agent, or Firm* — Mattingly & Malur, PC

(57) ABSTRACT

There is a need to provide a high-frequency power amplifier capable of reducing a talk current and reducing a phase deviation in output. The high-frequency power amplifier includes differently sized first through fifth power amplification transistors and impedance matching circuits for example. The high-frequency power amplifier changes a signal path to be used in accordance with a power specification signal. The high-frequency power amplifier uses a signal path from the first transistor to the second transistor in high power mode. The high-frequency power amplifier uses a signal path from the first transistor to the third transistor in medium power mode. The high-frequency power amplifier uses a signal path from the fourth transistor to the fifth transistor in low power mode. The high-frequency power amplifier is configured so that each of the signal paths includes the same number of stages of power amplification transistors and impedance matching circuits.

17 Claims, 11 Drawing Sheets ical Publication No. 2003-87059

HIGH-FREQUENCY POWER AMPLIFIER

CROSS-REFERENCE TO RELATED APPLICATIONS

The disclosure of Japanese Patent Application No. 2011-52994 filed on Mar. 10, 2011 including the specification, drawings and abstract is incorporated herein by reference in its entirety.

BACKGROUND

The present invention relates to a high-frequency power amplifier. More particularly, the invention relates to a technology effectively applicable to a high-frequency power amplifier that has multiple power modes and switches transistors used for the modes.

For example, patent document 1 describes the RF (Radio Frequency) amplifier that includes the high-power signal path, the low-power signal path, and the bypass signal path. Patent document 2 describes the high-frequency power amplifier that includes three paths between an input terminal and an output terminal and provides each path with a transistor and an output matching circuit. The transistors for the paths are differently sized. Patent document 3 describes the high-frequency power amplification module including the small output amplification portion and the large output amplification portion whose outputs are coupled to the common output matching circuit. The input matching circuit having high isolation characteristics is provided as an input portion for the small output amplification portion and the large output amplification portion.

Patent document 4 describes the high-frequency power amplifier that includes two paths between the input-side branch circuit and the output-side branch circuit. The variable phase shifter is provided near the input-side branch circuit. Patent document 5 describes the high-frequency power amplifier module that includes two paths between the input terminal and the output terminal and provides each path with the two-stage transistor and various matching circuits. One of the paths includes the switch circuit that short-circuits the path to the ground voltage.

Patent document 1: US patent No. 2009/0309656
Patent document 2: Japanese Unexamined Patent Publication No. 2002-271146
Patent document 3: Japanese Unexamined Patent Publication No. 2006-93773
Patent document 4: Japanese Unexamined Patent Publication No. 2003-87060
Patent document 5: Japanese Unexamined Patent Publication No. 2003-87059

SUMMARY

The high-frequency power amplifier (high-frequency power amplification module) provides the transmission function of mobile telephones, for example. Recently, the high-frequency power amplifier is requested to be miniaturized and decrease a talk current. The talk current represents an integrated value between the use frequency probability distribution of output levels during transmission and a consumption current at each output level. Decreasing the talk current can reduce the power consumption of mobile telephones and extend the battery life. FIG. 10 exemplifies the use frequency probability distribution of output levels from a W-CDMA (Wideband-Code Division Multiple Access) mobile telephone. As shown in FIG. 10, for example, a W-CDMA mobile telephone typically uses the range between approximately −30 dBm and 30 dBm around 0 dBm.

It is desirable to provide three or more power modes such as low power, medium power, and high power and switch transistors used for the power modes so that the talk current can be decreased at a wide range of output levels. That is, increasing the size of an transistor for amplification increases the maximum output power. Approximating an actual output power to the maximum output power yields high power added efficiency (PAE). The use of differently sized transistors for low power, medium power, and high power can ensure the high power added efficiency at a wide range of output levels and consequently reduce the talk current.

FIG. 11 exemplifies a configuration of a high-frequency power amplifier having three or more power modes. FIG. 11 is a block diagram showing an example configuration of a high-frequency power amplifier examined as a precondition to the present invention. The high-frequency power amplifier shown in FIG. 11 includes an impedance matching circuit and power divider circuit IMN&PDIV, a driver circuit DRV, impedance matching circuits IMN10' through IMN13', a main amplifier circuit MA, an impedance transformation circuit ITN, a bypass circuit BPN, and a bias control circuit VCTL. The BPN includes an amplifier circuit succeeded by an impedance matching circuit IMN14'.

The high-frequency power amplifier in FIG. 11 can provide three power modes and generate outputs using different paths corresponding to the modes. The high-power mode travels path PSh from IMN&PDIV, DRV, IMN10', IMN11', MA, IMN12', and then to IMN13' and uses two amplifier circuits DRV and MA for output. The medium-power mode travels path PSm from IMN&PDIV, DRV, IMN10', ITN, and then to IMN13' and uses one amplifier circuit DRV for output. The low-power mode travels path PSl from IMN&PDIV, BPN, ITN, and then to IMN13' and uses one amplifier circuit in the BPN for output.

Switching the amplifier circuits used for the power modes can reduce the talk current as described above. On the other hand, the number of amplifier circuits and matching circuits depends on the paths PSh, PSm, and PSl to be traveled. A phase deviation might occur between the paths. For example, the W-CDMA system uses the WMSA (Weighted Multi-Slot Averaging) technology that controls the demodulation based on states of not only the current slot but also slots before and after the current slot. Accurate demodulation might be difficult if a phase greatly varies before and after the power mode change.

The present invention has been made in consideration of the foregoing. It is therefore an object of the invention to provide a high-frequency power amplifier capable of reducing a talk current and reducing a phase deviation in output. These and other objects and novel features of the invention may be readily ascertained by referring to the following description and appended drawings.

The following summarizes representative embodiments of the invention disclosed in this application.

A high-frequency power amplifier according to an embodiment of the invention includes: a first terminal where a power signal is input; a second terminal where the amplified input power signal is output; a first impedance matching circuit provided between the power output terminal and a first node; and a first signal path and a second signal path that provide signal transmission paths from the power input terminal to the first node. The first signal path and the second signal path are switched in accordance with a power specification signal that is input to set power levels of a power signal at the second terminal. The first signal path is provided with: multiple stages of power amplification transistors including a first power amplification transistor as a last stage; and multiple impedance matching circuits including a second impedance matching circuit provided between an output node for the first power amplification transistor and the first node. The second signal path is provided with: multiple stages of power amplification transistors including a second power amplification transistor as a last stage; and multiple impedance matching circuits including a third impedance matching circuit provided between an output node for the second power amplification transistor and the first node. The number of stages of the power amplification transistors on the first signal path is equal to the number of stages of the power amplification transistors on the second signal path. The number of impedance matching circuits on the first signal path is equal to the number of impedance matching circuits on the second signal path.

The signal paths (power amplification transistors to be used) are switched in accordance with output power levels. This enables to reduce a talk current. Each signal path includes the same number of power amplification transistors and impedance matching circuits. This enables to reduce phase deviation occurring between signal paths. The output impedance matching circuit is configured as two stages, that is, one including the second and the third impedance matching circuits and the other including the first impedance matching circuit. This enables to reduce the circuit area while maintaining the number of impedance matching circuits. It is desirable to provide a third signal path in addition to the first and the second signal paths in order to more effectively reduce a talk current.

The high-frequency power amplifier can reduce a talk current and phase deviation in output. This can briefly summarize an effect resulting from representative embodiments of the invention disclosed in this specification.

DETAILED DESCRIPTION

Figure 1:
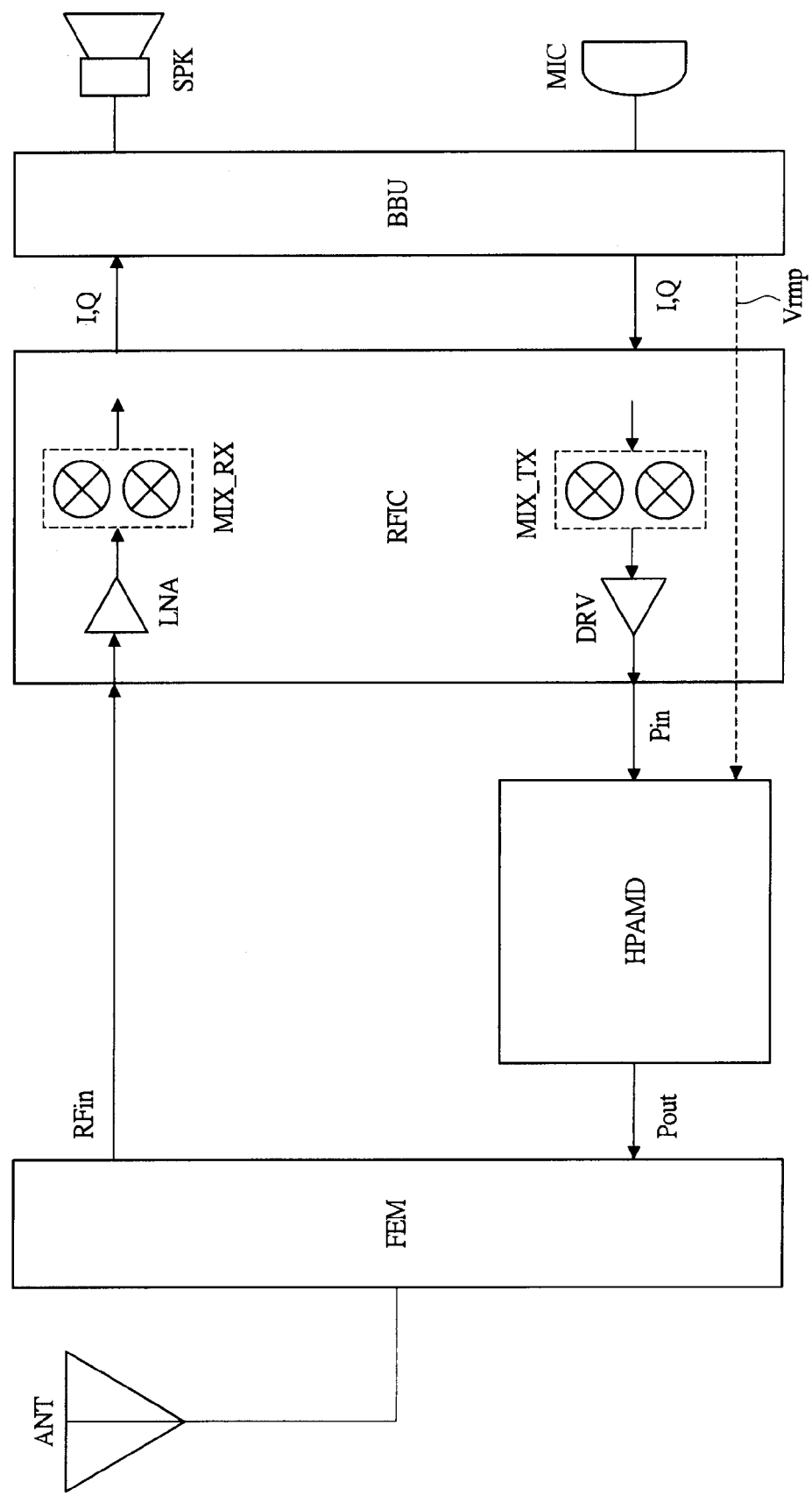
FIG. 1 is a block diagram schematically showing an example configuration of a wireless communication system using a high-frequency power amplifier according to a first embodiment of the invention.

The following description includes multiple embodiments or sections as needed. Unless expressly stated otherwise, the embodiments are not unrelated to each other. One of the embodiments provides modifications, details, or supplements for all or part of the others. The embodiments to be described may refer to numeric values including the number of elements or items, quantities, and ranges. The embodiments are not limited to but may be greater or smaller than specific numeric values, unless expressly stated otherwise, or unless the embodiments are limited to specific numeric values in principle.

Obviously, constituent elements including procedure steps are not necessarily requisite for the embodiments, unless expressly stated otherwise, or unless the elements are requisite in principle. The embodiments include those virtually approximate to or similar to shapes and positional relation of the constituent elements stated in the description, unless expressly stated otherwise, or unless considered inappropriate in principle. The same applies to the above-mentioned numeric values and ranges.

Embodiments of the present invention will be described in further detail with reference to the accompanying drawings. Throughout the drawings for illustrating the embodiments, the same members are designated by the same reference numerals and a repetitive description is omitted for simplicity.

First Embodiment

Schematic Configuration of the Wireless Communication System

FIG. 1 is a block diagram schematically showing an example configuration of a wireless communication system using a high-frequency power amplifier according to a first embodiment of the invention. The wireless communication system shown in FIG. 1 represents a W-CDMA mobile telephone system, for example. The wireless communication system includes an antenna ANT, a front-end module FEM, a high-frequency power amplifier (high-frequency power amplification module) HPAMD, a high-frequency signal processor RFIC, a baseband unit BBU, a speaker SPK, and a microphone MIC. The baseband unit BBU converts an analog signal from the microphone MIC into a digital signal and performs data modulation or spread modulation on the digital signal. In this manner, the baseband unit BBU generates an I signal and a Q signal and outputs them to the high-frequency signal processor RFIC. The BBU demodulates a digital signal by performing data demodulation or spread demodulation on an I signal and a Q signal supplied from the RFIC. The BBU converts the demodulated digital signal into an analog signal and outputs it from the speaker SPK.

The high-frequency signal processor RFIC mainly includes a transmission mixer circuit MIX_TX, a driver circuit DRV, a low-noise amplifier circuit LNA, and a reception mixer circuit MIX_RX. The MIX_TX receives an I signal and a Q signal from the BBU using orthogonally crossing carrier signals and up-converts (wirelessly modulates) the received signals into specified wireless frequencies. The DRV receives an output signal from the MIX_TX and outputs the received signal as an input power signal Pin to the high-frequency power amplification module HPAMD. The LNA amplifies a high-frequency signal RFin supplied from the front-end module FEM. The MIX_RX down-converts (wirelessly demodulates) an output signal from the LNA into a specified baseband frequency using orthogonally crossing carrier signals and outputs resulting I and Q signals to the BBU.

The high-frequency power amplification module HPAMD amplifies the power of the input power signal Pin supplied from the high-frequency signal processor RFIC and outputs an output power signal Pout to the front-end module FEM. As the detail will be described later, the HPAMD controls switchover between internally used amplification transistors (power mode settings) and amplification transistor bias values based on a power specification signal Vrmp supplied from the baseband unit BBU via the RFIC. The FEM includes, for example, a duplexer or an antenna switch for separating transmission and reception frequencies, transmits Pout to the antenna ANT, receives a signal from the ANT, and transmits the received signal as RFin.

Schematic Configuration of the High-Frequency Power Amplification Module [1]

Figure 2:
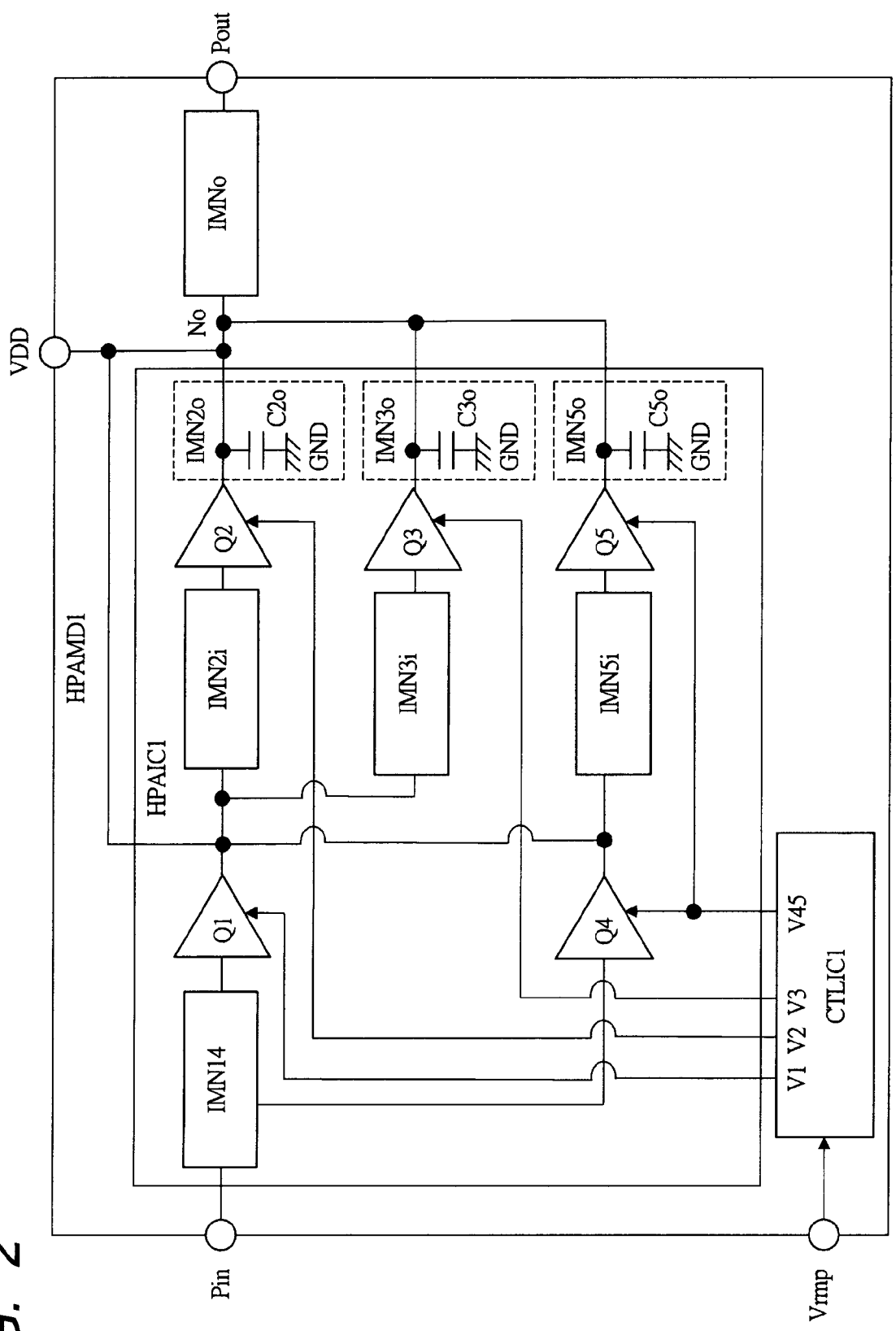
FIG. 2 is a block diagram schematically showing an example configuration of the high-frequency power amplifier according to the first embodiment of the invention.

FIG. 2 is a block diagram schematically showing an example configuration of the high-frequency power amplifier according to the first embodiment of the invention. A high-frequency power amplifier (high-frequency power amplification module) HPAMD1 shown in FIG. 1 is configured on a wiring substrate (PCB) of ceramics, for example. The PCB is mounted with a high-frequency power amplification chip HPAIC1 and a control chip CTLIC1 and includes an impedance matching circuit IMNo formed using a wiring layer on the PCB. The HPAIC1 is equivalent to an MMIC (Monolithic Microwave Integrated Circuit) and includes impedance matching circuits IMN14, IMN2$i$, IMN3$i$, IMN5$i$, IMN2$o$, IMN3$o$, and IMN5$o$ and power amplification transistors Q1 through Q5. The Q1 through Q5 are supplied with power supply voltage VDD from external terminals.

The IMN14 matches impedance at the external terminal supplied with the input power signal Pin with input impedance of the Q1 and input impedance of the Q4. The IMN2$i$ matches output impedance of the Q1 with input impedance of the Q2. The IMN3$i$ matches output impedance of the Q1 with input impedance of the Q3. The IMN2$o$ matches output impedance of the Q2 with input impedance of the IMNo. The IMN3$o$ matches output impedance of the Q3 with input impedance of the IMNo. The IMN5$i$ matches output impedance of the Q4 with input impedance of the Q5. The IMN5$o$ matches output impedance of the Q5 with input impedance of the IMNo. The IMN2$o$ includes a capacitor C2$o$ inserted between the Q2 output node and a ground power supply voltage GND. The IMN3$o$ includes a capacitor C3$o$ inserted between the Q3 output node and the GND. The IMN5$o$ includes a capacitor C5$o$ inserted between the Q5 output node and the GND.

The impedance matching circuit IMNo matches impedance of a common output node No for the IMN2$o$, IMN3$o$, and IMN5$o$ with impedance of an external terminal to which the output power signal Pout is output. The control chip CTLIC1 is provided as a semiconductor chip that forms circuits on a silicon substrate using CMOS (Complementary Metal Oxide Semiconductor) processes, for example. The CTLIC1 receives the above-mentioned power specification signal Vrmp and accordingly uses control signals V1 through V3 and V45 to control activation or inactivation (power mode settings) of the Q1 through Q5 or to control bias values (power gains) for the power amplification transistors that are activated as well. The transistors Q2, Q3, and Q5 are sized in accordance with the relation of Q2>Q3>Q5. The transistors Q1 and Q4 are sized in accordance with the relation of Q1>Q4. The transistors Q1 through Q5 are sized in accordance with a ratio of Q2:Q3:Q1:Q5:Q4=40:16:8:1:1, though not limited thereto. Output impedances for the Q2, Q3, and Q5 indicate the relation of Q2<Q3<Q5 in accordance with the above-mentioned transistor sizes. Capacitance values for the C2$o$, C3$o$, and C5$o$ indicate the relation of C7$o$<C3$o$<C5$o$ so as to equalize the output impedances.

The configuration in FIG. 2 can provide three power modes for high power, medium power, and low power in accordance with the power specification signal Vrmp. In the high power mode, the CTLIC1 activates Q1 and Q2 and inactivates Q3 through Q5. An output path follows IMN14, Q1, IMN2$i$, Q2, IMN2$o$, and then IMNo. In the medium power mode, the CTLIC1 activates Q1 and Q3 and inactivates Q2, Q4, and Q5. An output path follows IMN14, Q1, IMN3$i$, Q3, IMN3$o$, and then IMNo. In the low power mode, the CTLIC1 activates Q4 and Q5 and inactivates Q1 through Q3. An output path follows IMN14, Q4, IMN5$i$, Q5, IMN5$o$, and then IMNo. Though not limited thereto, the high power mode corresponds to the output power signal Pout of 20 dBm or greater. The medium power mode corresponds to Pout of 10 dBm through 20 dBm. The low power mode corresponds to Pout of 10 dBm or less.

Major Features and Effects of the First Embodiment

Figure 10:
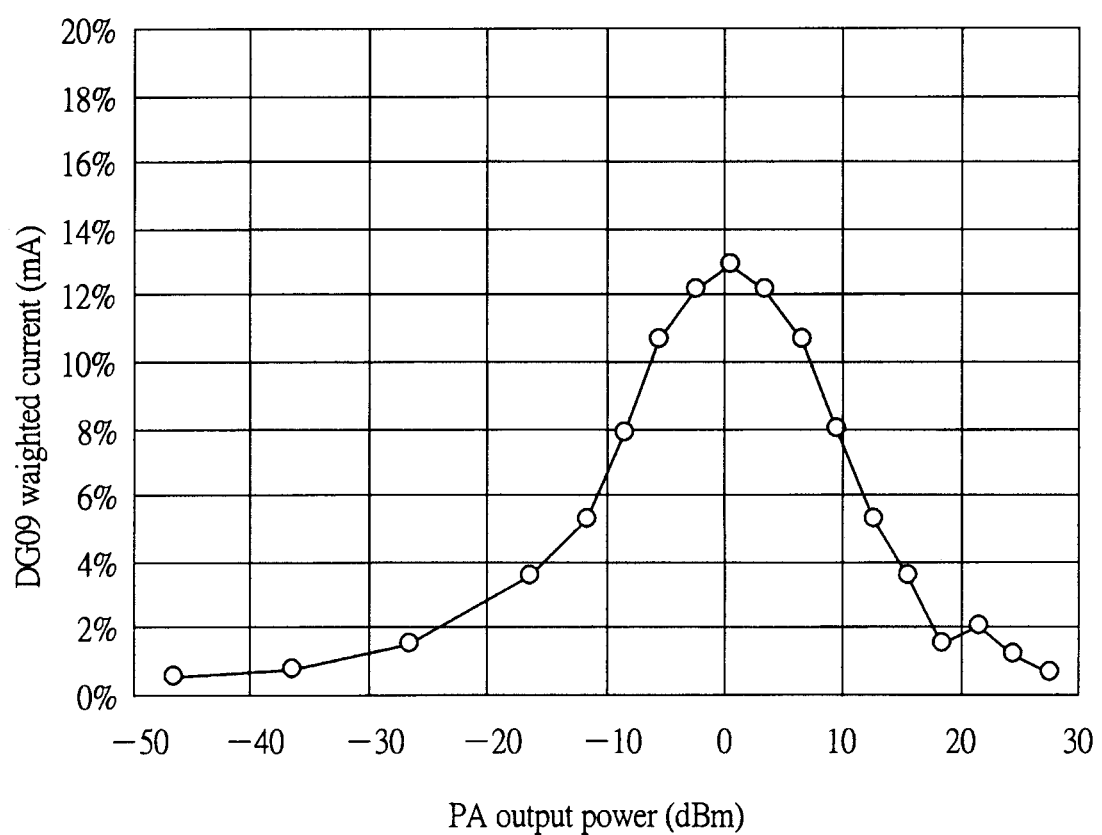
FIG. 10 exemplifies the use frequency probability distribution of output levels from a W-CDMA mobile telephone.
Figure 11:
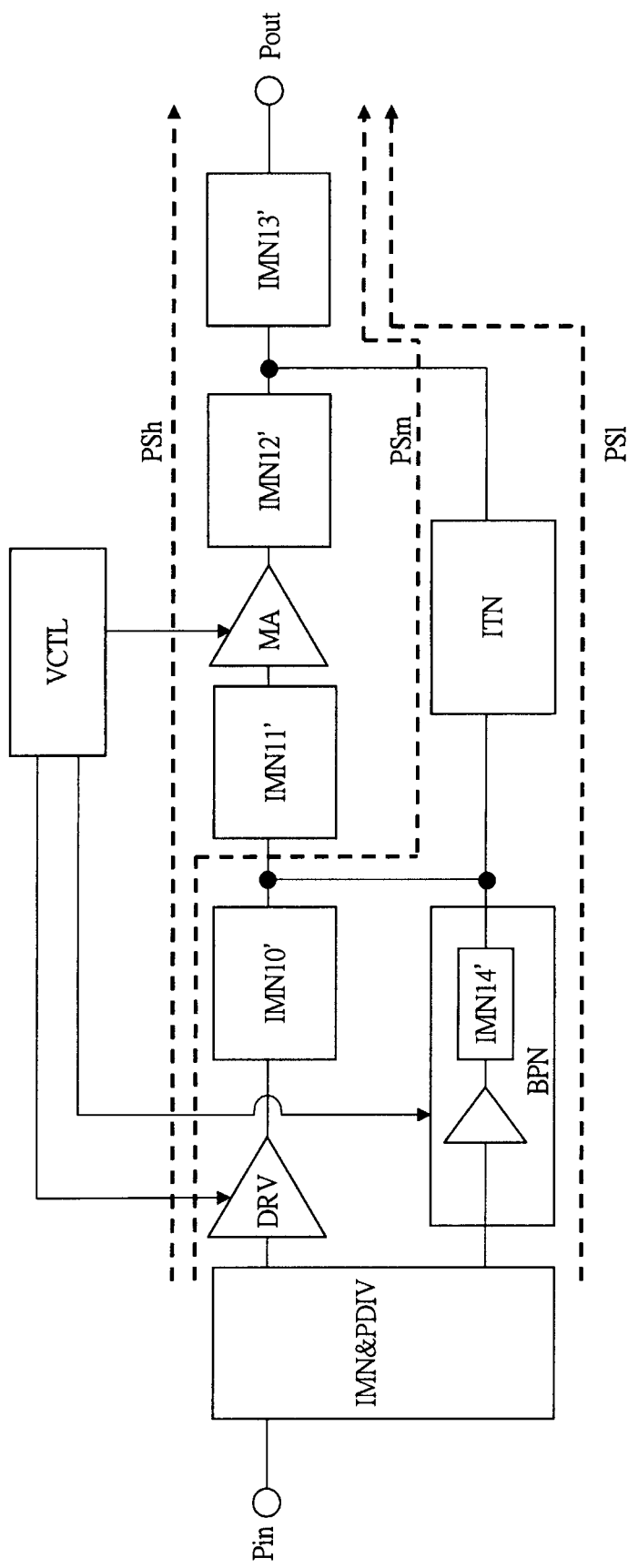
FIG. 11 is a block diagram showing an example configuration of a high-frequency power amplifier examined as a precondition to the present invention.

The configuration as shown in FIG. 2 provides the following features and effects. As a first feature, the configuration provides three paths to the three power modes and uses multiple (two in this example) power amplification transistors for each path. For example, the configuration described in patent document 2 or 3 above provides two power modes and amplifies the power using one power amplification transistor. Such a configuration might be incapable of a wide range of output levels. It is desirable to be capable of configuring three or more power modes in order to ensure a wide range of output levels as shown in FIG. 10. In addition, it is desirable to amplify the power using multiple power amplification transistors in order to ensure a particularly high output level. As a result, a talk current can be reduced in a wide range of output levels. The configuration in FIG. 2 improves the talk current reduction effect by using the low power mode for approximately 0 dBm that is used most often.

As a second feature, the number of power amplification transistors is equal to the number of impedance matching circuits on three paths corresponding to the three power modes. The power amplification transistor causes a phase difference of up to 180 degrees depending on inductance components and capacitance components. The impedance matching circuit also causes a phase difference depending on passive elements (capacitors or inductors) and coupling methods. Conceptually, a series coupled capacitor or a parallel coupled inductor advances the phase. A parallel coupled capacitor or a series coupled inductor delays the phase. The phase deviation between paths can be reduced if each path includes the same number of power amplification transistors and impedance matching circuits. The reception side can ensure highly reliable demodulation even if the power mode changes during an output process.

As specific features for reducing the phase deviation, the configuration in FIG. 2 uses two power amplification transistors (Q4 and Q5) in the lower power mode and provides the impedance matching circuit IMN2$o$ for the output node of the Q2 in the high power mode. Basically, the low power mode can use one power amplification transistor. The IMN2$o$ provided for the output node of the Q2 can be eliminated if the output impedance of the Q2 is combined with the input impedance of the IMNo in the high power mode. In this case, the circuit area can be reduced. However, the phase deviation occurs. In consideration of this, the configuration in FIG. 2 intentionally provides not only two power amplification transistors for each path but also the IMN2o to make the number of impedance matching circuits equal to that of power amplification transistors.

As a third feature, the output impedance matching circuits are divided into two parts. One includes the impedance matching circuits IMN2o, IMN3o, and IMN5o corresponding to the power amplification transistors Q2, Q3, and Q5. The other includes the common impedance matching circuit IMNo. For example, it might be possible to provide one impedance matching circuit dedicated to each one of the power amplification transistors Q2, Q3, and Q5 between the output nodes of the Q2, Q3, and Q5 and the external terminal (Pout). However, this configuration might increase the area size for the impedance matching circuits. As mentioned above, dividing the output impedance matching circuits can restrain the circuit area from increasing. As will be described in detail with reference to FIG. 3, the input impedance matching circuit IMN14 for the Q1 and Q4 in FIG. 2 is also configured in accordance with the second and third features.

As comparison examples, the configuration described in patent document 1 does not have the second feature and might cause phase deviation. Patent document 2 includes no description about providing each path with the same number of multiple power amplification transistors. Patent documents 3, 4, and 5 include no description about a configuration of using three or more power modes. Patent documents 2 and 5 disclose the configuration that provides one dedicated output impedance matching circuit for each one of output portions on the paths. This configuration is similar to that which provides one output impedance matching circuit dedicated to each one of the power amplification transistors Q2, Q3, and Q5 between the output nodes of the Q2, Q3, and Q5 and the external terminal (Pout) as described above. Such a configuration might increase the area size for the output impedance matching circuits. Patent document 4 includes the description about phase deviation and solves this problem by providing a variable phase shifter for the input side. However, there is no description about the output impedance matching circuit. Increasing the range of output levels causes a large difference in transistor sizes at the last stage. More consideration is needed for the output side (output impedance matching circuit) than for the input side in order to reduce the phase deviation.

Detailed Configuration of the High-Frequency Power Amplification Module [1]

Figure 3:
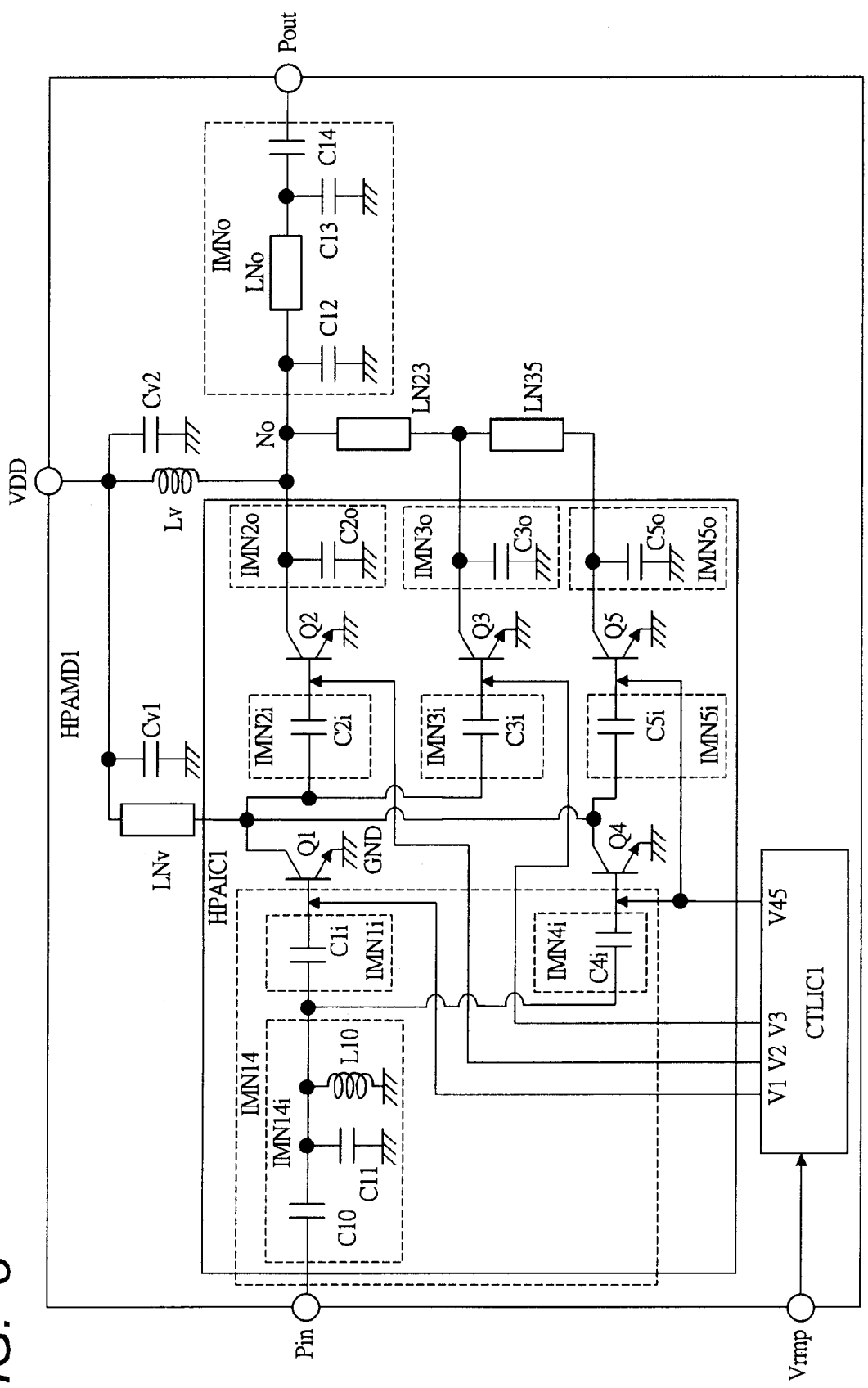
FIG. 3 is a circuit diagram showing in detail an example configuration of the high-frequency power amplifier in FIG. 2.

FIG. 3 is a circuit diagram showing in detail an example configuration of the high-frequency power amplifier in FIG. 2. In FIG. 3, the power amplification transistors Q1 through Q5 represent npn-type heterojunction bipolar transistors (HBTs) whose emitters are grounded. The transistors Q1 through Q3 each have the emitter area of 3×40 μm, for example, and are provided as unit transistors (referred to as fingers) that are parallel coupled for specified quantities (referred to as multi-finger structure). If structure xF includes x fingers, it is represented as Q2:Q3:Q1:Q5:Q4=40F:16F:8F: 1F:1F, for example.

The Q3 collector functions as an output node and is coupled to the common output node No through a transmission line LN23 formed on a module wiring substrate (PCB). The Q5 collector functions as an output node and is coupled to one end of the LN23 through a transmission line LN35 formed on the PCB and then to the No through the LN23. The common output node No is provided on the PCB according to the example and may be provided inside the high-frequency power amplification chip HPAIC1 including the LN23 and the LN35 depending on cases.

The Q1 and Q4 collectors function as output nodes and are supplied with the power supply voltage VDD through a transmission line LNv functioning as an inductor on the PCB. The common output node No is supplied with the VDD through an inductor (choke coil) Lv mounted on the PCB. The VDD is supplied to the Q2 collector as well as to the Q3 and Q5 collectors through the LN23 and the LN35. A capacitor Cv1 for AC ground is provided between one end of the LNv (not the Q1 side) and the ground power supply voltage GND. A capacitor Cv2 for AC ground is provided between one end of the Lv (not the No side) and the GND. This specification makes no distinction between an inductor and a coil.

The impedance matching circuit IMN14 includes capacitors C10, C11, C1i, and C4i and an inductor L10. One end of the C1i is coupled to the Q1 base. One end of the C4i is coupled to the Q4 base. The other ends of the C1i and the C4i are coupled in common. One end of the C10 is coupled to the external terminal (Pin) and the other end thereof is coupled to a common coupling node for the C1i and the C4i. The C11 and the L10 are parallel coupled between the common coupling node for the C1i and the C4i and the GND. The C10, the C11, and the L10 configure an impedance matching circuit IMN14i common to the Q1 and the Q4. The C1i configures an impedance matching circuit IMN1i for the Q1. The C4i configures an impedance matching circuit IMN4i for the Q4. Adjusting C1i and C4i capacitance values can solve an input impedance difference between the Q1 and the Q4.

The impedance matching circuits IMN2i, IMN3i, and IMN5i respectively include capacitors C2i, C3i, and C5i each inserted in series between the input and the output of the corresponding impedance matching circuit. Appropriately setting the capacitance values conforms to the transistors Q2, Q3, and Q5 having different input impedances. The impedance matching circuit IMNo includes capacitors C12 through C14 mounted on the PCB and a transmission line LNo functioning as an inductor. One end of the C14 is coupled to the external terminal (Pout) and the other end thereof is coupled to one end of the LNo. The other end of the LNo is coupled to the common output node No. The C12 and the C13 are coupled between each of both ends of the LNo and the GND. The C12, the LNo, and the C13 configure a so-called π-type matching circuit and also provides the low-pass filter function. The control chip CTLIC1 appropriately controls base biases for the Q1 through the Q5 to control activation and inactivation (i.e., power modes) of the Q1 through the Q5 and control power gains for power amplification transistors to be activated.

Ideally, as shown in FIG. 3, it is desirable to keep the same number of impedance matching circuits on the three paths as mentioned above in order to reduce the phase deviation. It is also desirable to allow each path to include the same number of various passive elements (series capacitors, parallel capacitors, series inductors, and parallel inductors) to pass through within each impedance matching circuit. Actually, however, the paths might be prone to different parasitic components due to the transmission lines or wirings within the chip on the PCB. The number of passive elements may be approximately equal to each other and need not be strictly equal to each other if the resulting phase deviation belongs to an allowable range. Different semiconductor chips are used for the HPAIC1 and the CTLIC1 because HBTs are used for the Q1 through the Q5. The HPAIC1 and the CTLIC1 can be integrated into one semiconductor chip if, for example, an LDMOS (Laterally Diffused Metal Oxide Semiconductor)

can provide the power amplification transistor though the LDMOS features less quality characteristics than the HBT. The capacitors C2o, C3o, and C5o may be formed on the PBC. However, forming them within the HPAIC1 can save the space and enable high Q values.

Figure 4A:
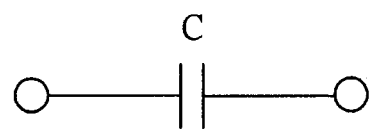
FIGS. 4A through 4C are circuit diagrams exemplifying different circuit systems for the interstage impedance matching circuits in FIG. 2.
Figure 4B:
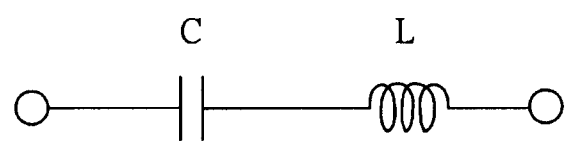
Figure 4C:
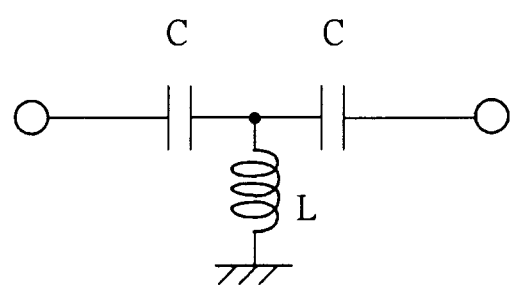

FIGS. 4A through 4C are circuit diagrams exemplifying different circuit systems for the interstage impedance matching circuits in FIG. 2. The interstage impedance matching circuits IMN2i, IMN3i, and IMN5i in FIG. 2 are available as the circuit systems in FIGS. 4A through 4C, for example. The circuit system in FIG. 4A includes one capacitor C. The circuit system in FIG. 4B represents a series-coupled circuit including the capacitor C and an inductor L. The circuit system in FIG. 4C represents a so-called T-type matching circuit including two capacitors C and one inductor L. The example in FIG. 3 uses the circuit system shown in FIG. 4A. Appropriate circuit systems may be selected from FIGS. 4A through 4C in accordance with impedance conversion rates. However, all the IMN2i, the IMN3i, and the IMN5i preferably use the same circuit system from the viewpoint of using the same number of passive elements as mentioned above.

The high-frequency power amplifier according to the first embodiment can reduce a talk current and the phase deviation in outputs.

Second Embodiment

Schematic Configuration of the High-Frequency Power Amplification Module [2]

Figure 5:
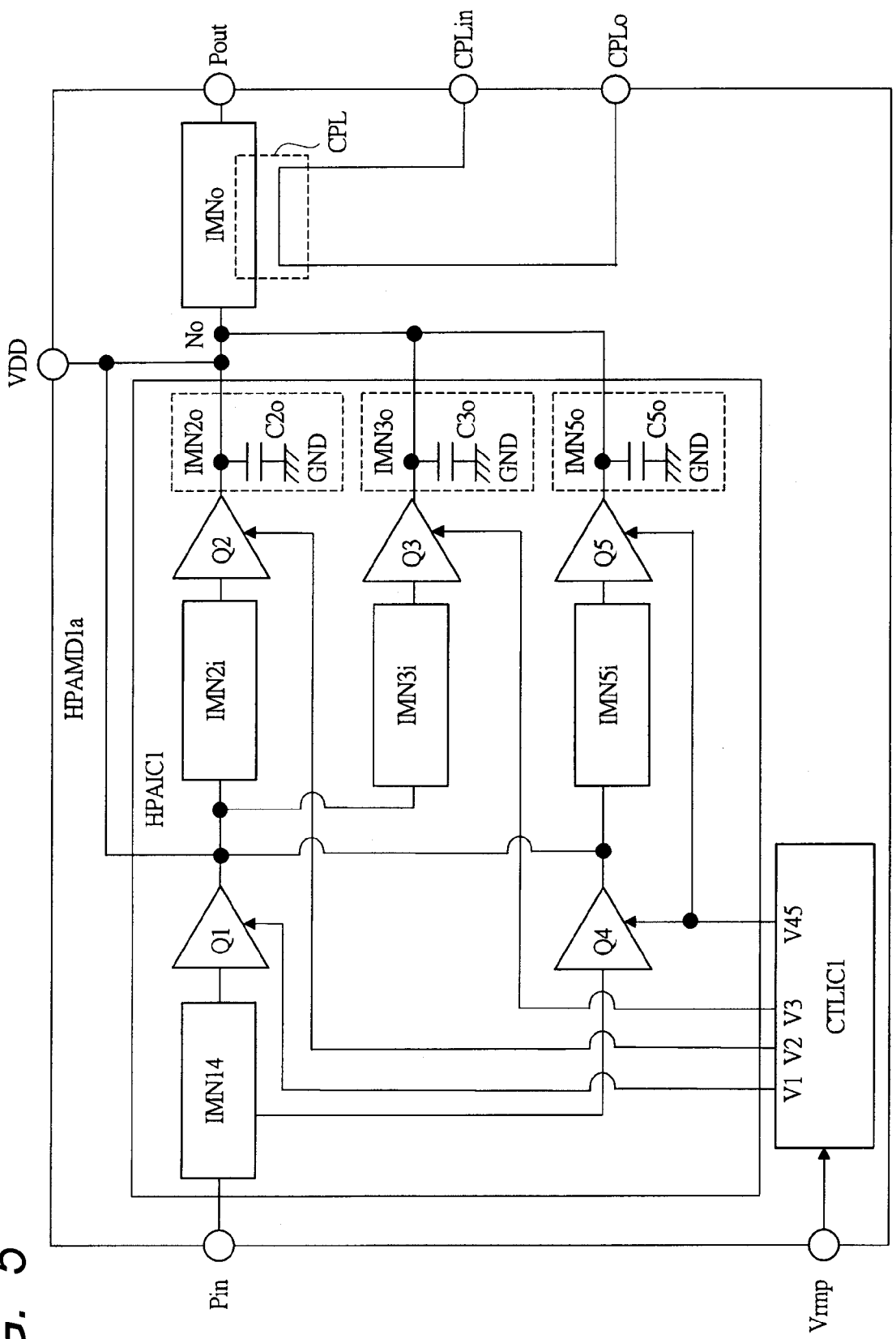
FIG. 5 is a block diagram schematically showing an example configuration of a high-frequency power amplifier according to a second embodiment of the invention.

FIG. 5 is a block diagram schematically showing an example configuration of a high-frequency power amplifier according to the second embodiment of the invention. A high-frequency power amplifier (high-frequency power amplification module) HPAMD1a shown in FIG. 5 differs from the high-frequency power amplification module HPAMD1 shown in FIG. 2 in that a coupler CPL is added. The CPL includes a transmission line on the wiring substrate (PCB). One end of the CPL is coupled to an external terminal for coupler input signal CPLin. The other end thereof is coupled to an external terminal for coupler output signal CPLo. The transmission line is provided near and parallel to part of the impedance matching circuit IMNo (e.g., the transmission line LNo in FIG. 3) and detects the amplitude of power passing through the IMNo using the electromagnetic coupling.

The external terminal (CPLin) is directly or indirectly coupled to a termination circuit. The external terminal (CPLo) is directly or indirectly coupled to a power value detection circuit. If the wireless communication system is provided with multiple modules HPAMD1a in FIG. 5, for example, the external terminal (CPLo) of one HPAMD1a is coupled to the external terminal (CPLin) of another HPAMD1a in succession to form a serial path. The termination circuit and the power value detection circuit are coupled to both ends of the serial path. According to this configuration, the high-frequency power amplifier can actually verify an output level specified by the power specification signal Vrmp using a detection result from the power value detection circuit. If an error is found, the high-frequency power amplifier can correct the output level by adjusting the base bias for the power amplification transistor. This enables to highly accurately configure an output level. Forming the serial path can reduce the circuit area in comparison with the method of providing the termination circuit or the power value detection circuit for every HPAMD1a.

Third Embodiment

Schematic Configuration of the High-Frequency Power Amplification Module [3]

Figure 6:
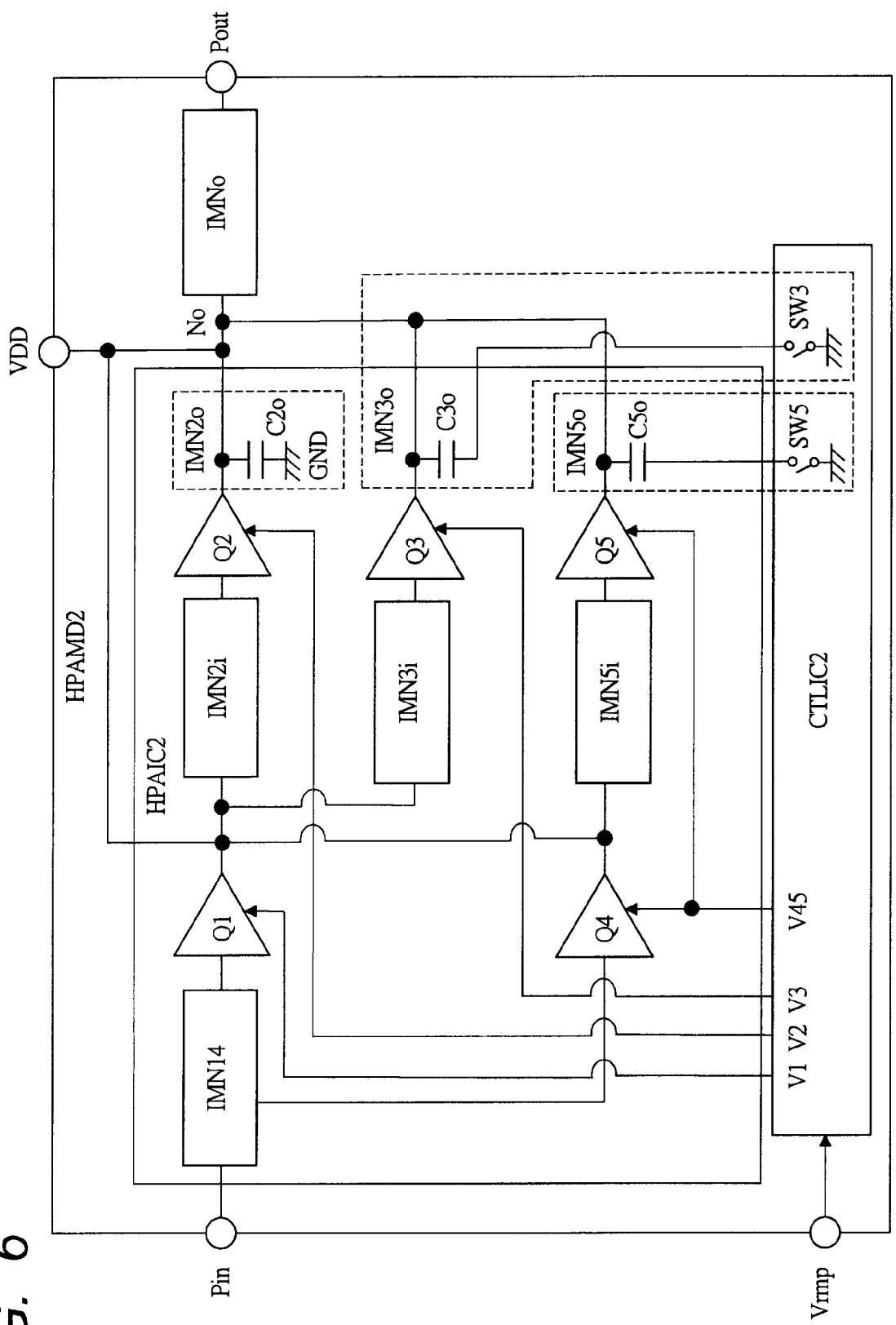
FIG. 6 is a block diagram schematically showing an example configuration of a high-frequency power amplifier according to a third embodiment of the invention.

FIG. 6 is a block diagram schematically showing an example configuration of a high-frequency power amplifier according to the third embodiment of the invention. A high-frequency power amplifier (high-frequency power amplification module) HPAMD2 in FIG. 6 differs from the high-frequency power amplification module HPAMD1 in FIG. 2 in configurations of the impedance matching circuits IMN3o and IMN5o in the high-frequency power amplification chip HPAIC2. As shown in FIG. 6, the IMN3o includes the capacitor C3o and a switch circuit SW3. One end of the capacitor C3o is coupled to the output node of the power amplification transistor Q3. The switch circuit SW3 is coupled between the other end of the C3o and the ground power supply voltage GND. Similarly, the IMN5o includes the capacitor C5o and a switch circuit SW5. One end of the capacitor C5o is coupled to the output node of the power amplification transistor Q5. The switch circuit SW5 is coupled between the other end of the C5o and the GND. The SW3 and the SW5 are provided within the control chip CTLIC2 and use MOS transistors.

The CTLIC2 turns off the SW3 and the SW5 to enable the high power mode. The CTLIC2 turns on the SW3 and turns off the SW5 to enable the medium power mode. The CTLIC2 turns off the SW3 and turns on the SW5 to enable the low power mode. According to the configuration in FIG. 2, for example, power output from the Q2 leaks to the GND through the capacitors C3o and C5o in the IMN3o and the IMN5o in the high power mode. Power output from the Q3 leaks to the GND through the C5o in the medium power mode. This might decrease the power added efficiency. As seen from the configuration in FIG. 6, providing the SW3 and the SW5 can decrease the power leakage and can improve the power added efficiency or reduce a talk current more than the configuration in FIG. 2.

In FIG. 6, a switch circuit may be also added to the capacitor C2o in the impedance matching circuit IMN2o. As already described with reference to FIG. 2, however, the capacitance value of the C2o is smaller than that of the C3o or the C5o. The power leakage through the C2o might be negligible in the medium or lower power mode. In consideration of this, the switch circuit for the C2o is omitted to reduce the circuit area.

Fourth Embodiment

Schematic Configuration of the High-Frequency Power Amplification Module [4]

Figure 7:
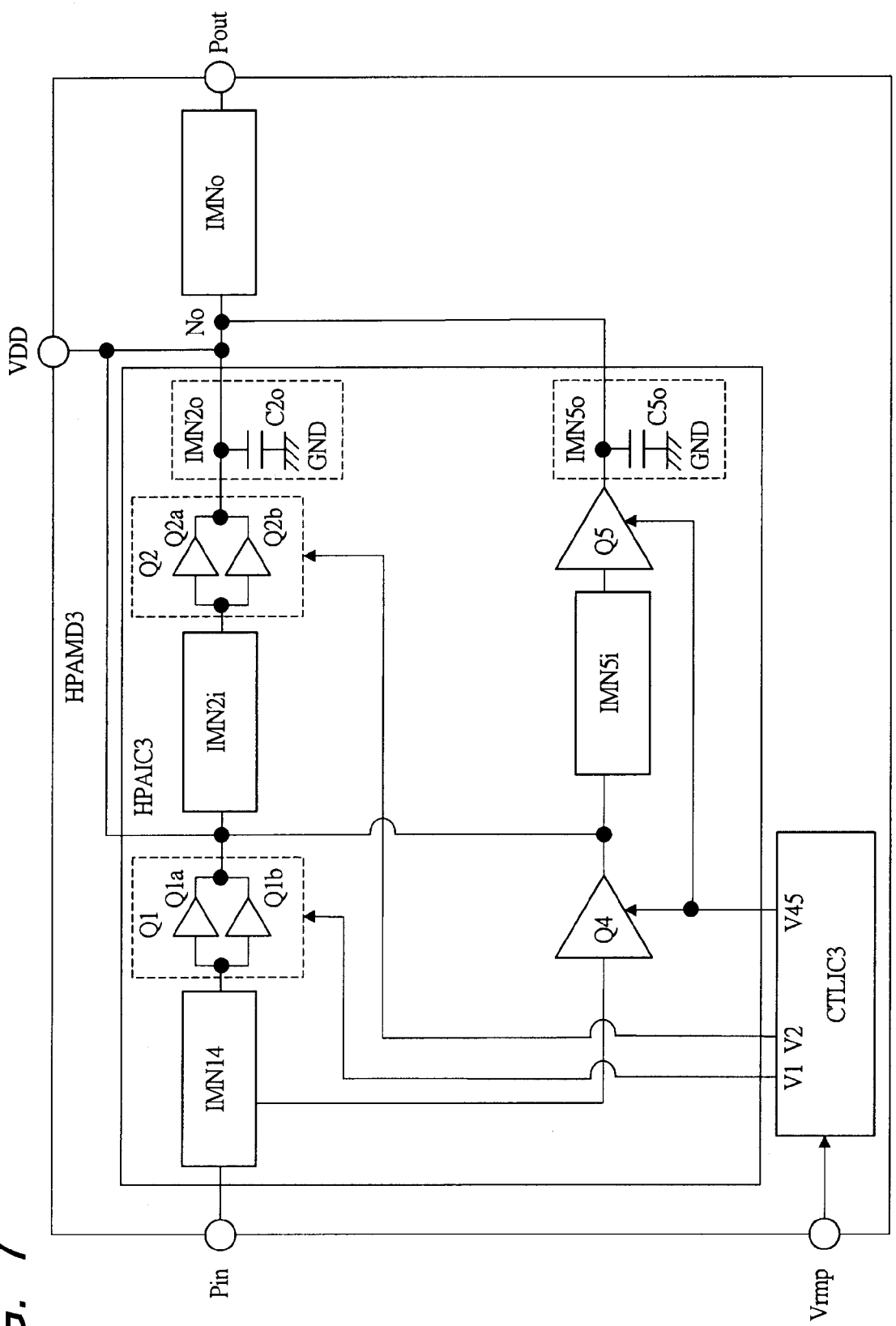
FIG. 7 is a block diagram schematically showing an example configuration of a high-frequency power amplifier according to a fourth embodiment of the invention.

FIG. 7 is a block diagram schematically showing an example configuration of a high-frequency power amplifier according to the fourth embodiment of the invention. A high-frequency power amplifier (high-frequency power amplification module) HPAMD3 shown in FIG. 7 is configured so as to eliminate the impedance matching circuit IMN3i, the power amplification transistor Q3, and the impedance matching circuit IMN3o for medium power from the high-frequency power amplification module HPAMD1 shown in FIG. 2. Instead, a high-frequency power amplification chip HPAIC3 in FIG. 7 uses the above-mentioned path in the high power mode (from IMN1i, Q1, IMN2i, Q2, IMN2o, and then to IMNo) for the medium power mode as well. The configuration is changed so as to be capable of changing sizes of the power amplification transistors Q1 and Q2. The Q1 is divided into two power amplification transistors Q1a and Q1b that share input and output. The Q2 is also divided into two power amplification transistors Q2a and Q2b that share input and output. Each of the divided transistors can be activated or inactivated.

Figure 8:
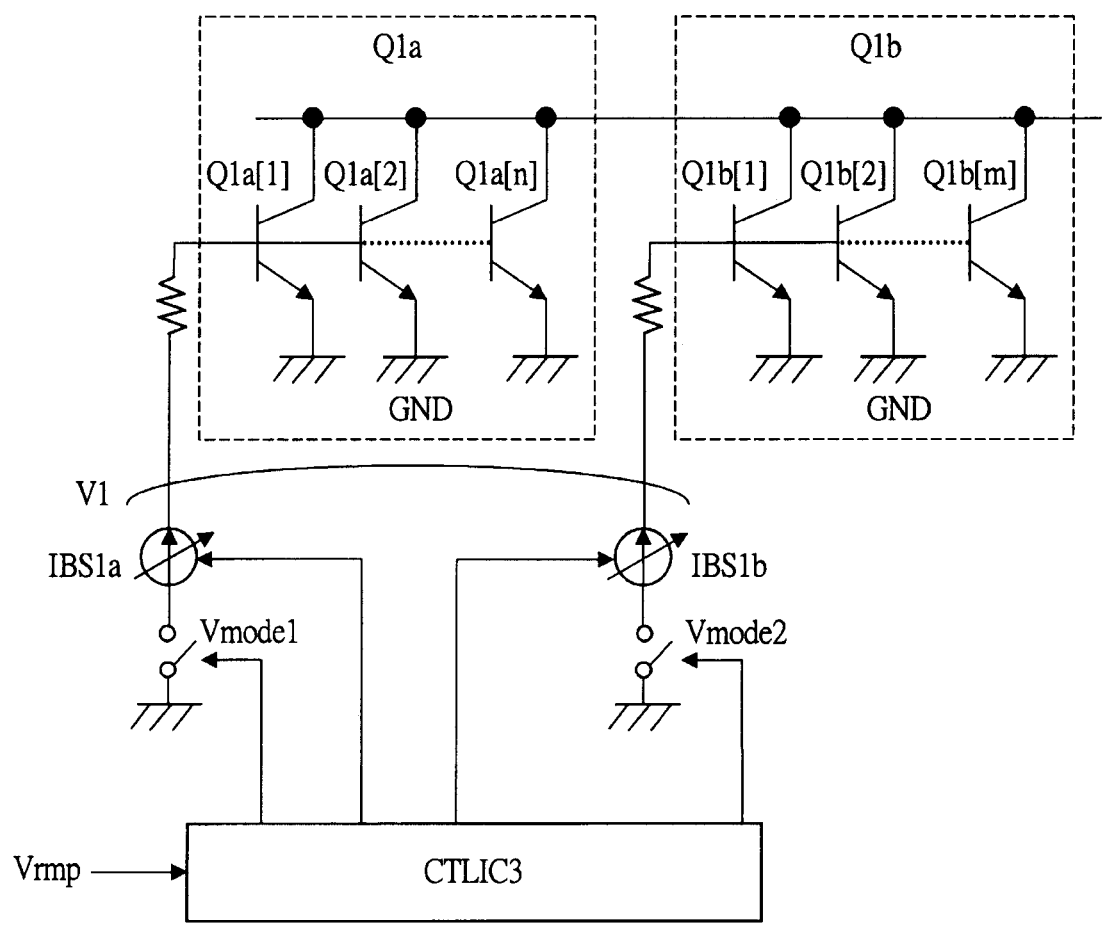
FIG. 8 is a circuit diagram showing in detail an example configuration around a power amplification transistor in FIG. 7.

FIG. 8 is a circuit diagram showing in detail an example configuration around the power amplification transistor in FIG. 7. The following describes the power amplification transistor Q1 in FIG. 7 as an example. The Q2 also has the same configuration. As mentioned above, the power amplification transistor has the multi-finger structure including multiple unit transistors (fingers) whose emitters, bases, and collectors are coupled in common. In FIG. 8, the multi-finger structure of the Q1 is divided into two groups. Each group can be independently supplied with the base bias.

As shown in FIG. 8, the Q1 includes as many as n+m heterojunction bipolar transistors (unit transistors) Q1a[1] through Q1a[n] and Q1b[1] through Q1b[m] whose emitters and collectors are coupled in common. The Q1a[1] through the Q1a[n] are equivalent to the power amplification transistor Q1a in FIG. 7. The bases are coupled in common and are supplied with a bias current from a bias current source IBS1a via a control chip CTLIC3. Similarly, the Q1b[1] through the Q1b[m] are equivalent to the power amplification transistor Q1b in FIG. 7. The bases are coupled in common and are supplied with a bias current from a bias current source IBS1b via the control chip CTLIC3. The CTLIC3 generates mode setup signals Vmode1 and Vmode2 in accordance with the power specification signal Vrmp to independently control whether to supply the IBS1a and the IBS1b or whether to activate or inactivate the Q1a and the Q1b.

In FIG. 7, for example, the power amplification transistors Q1a and Q1b are assumed to each include four fingers. The power amplification transistors Q2a and Q2b are assumed to each include 20 fingers. In this case, the control chip CTLIC3 provides control so as to activate all the transistors Q1a, Q1b, Q2a, and Q2b in the high power mode and activate the transistors Q1a and Q2a and inactivate the transistors Q1b and Q2b in the medium power mode. This enables to change the power amplification transistor sizes for medium power and high power and ensure the same number of amplification transistors or impedance matching circuits for medium power and high power. As a result, an effect similar to the configuration in FIG. 2 is available. Compared to the configuration in FIG. 2, the configuration in FIG. 7 can reduce the circuit area due to elimination of the IMN3i, the Q3, and the IMN3o and can decrease the power leakage as described in FIG. 6 due to elimination of the branch point for the Q3 output portion.

It is also effective to add a switch circuit to the capacitor C5o in the configuration of FIG. 7 similar to the configuration in FIG. 6.

Fifth Embodiment

Schematic Configuration of the High-Frequency Power Amplification Module [5]

Figure 9:
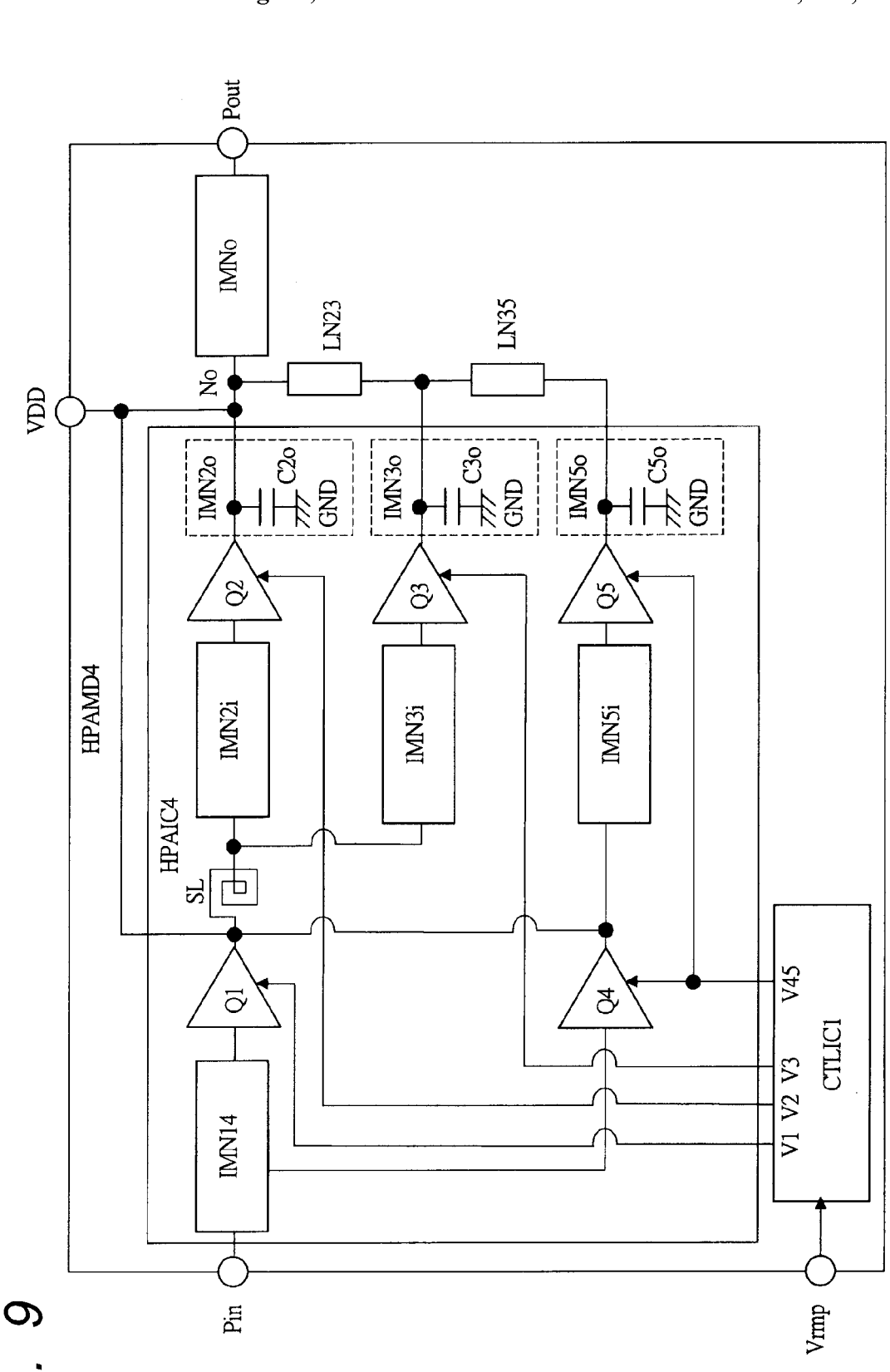
FIG. 9 is a block diagram schematically showing an example configuration of a high-frequency power amplifier according to a fifth embodiment of the invention.

FIG. 9 is a block diagram schematically showing an example configuration of a high-frequency power amplifier according to the fifth embodiment of the invention. A high-frequency power amplifier (high-frequency power amplification module) HPAMD4 shown in FIG. 9 differs from the high-frequency power amplification module HPAMD1 shown in FIGS. 2 and 3 in that a spiral inductor SL is added inside a high-frequency power amplification chip HPAIC4. The SL is coupled between the output node for the power amplification transistor Q1 and the common input node for the impedance matching circuits IMN2i and IMN3i. For example, there may be a case of increasing the length of the transmission line LN35 that couples the output node for the Q3 and the output node for the Q5. Inductor components accordingly might become rather significant from the viewpoint of phase deviation. To solve this problem, the configuration in FIG. 9 provides the LS as a dummy element for the LN35.

While there have been described specific preferred embodiments of the present invention made by the inventors, it is to be distinctly understood that the invention is not limited thereto but may be otherwise variously embodied within the spirit and scope of the invention.

For example, the embodiments have been described as the high-frequency power amplification modules for W-CDMA that particularly requires reducing a talk current. Obviously, the invention is also applicable to GSM (Global System for Mobile communication) and DCS (Digital Cellular System). The W-CDMA is also referred to as UMTS (Universal Mobile Telecommunications System). There have been described the single-band high-frequency power amplification modules for W-CDMA. The invention is also applicable to multi-band high-frequency power amplification modules by mounting multiple high-frequency power amplification chips HPAIC1 on the high-frequency power amplification module HPAMD1 in FIG. 2, for example.

While the above-mentioned embodiments use the three power modes, four or more power modes may be provided. Two power modes may be provided depending on cases. As mentioned above, it is desirable to provide three or more power modes in order to comply with a wide range of output levels. However, one of the major features of the embodiments is to reduce the phase deviation between signal transmission paths in each power mode. Therefore, two power modes are available from this viewpoint. In each power mode, the path may include not only two but also three or more power amplification transistors.

The high-frequency power amplifier according to the embodiments is favorably applicable to power transmission portions in mobile telephone systems for W-CDMA. The high-frequency power amplifier is also applicable to mobile telephone systems compliant to various standards including GSM, DCS, and LTE (Long Term Evolution) as well as W-CDMA. Multiple power modes are configurable on mobile telephone systems and other systems. The high-frequency power amplifier is widely applicable to battery-driven wireless communication systems in general that need to reduce power consumption.

What is claimed is:

1. A high-frequency power amplifier comprising:
 a first terminal where a first power signal is input;
 a second terminal where a second power signal is output, the second power signal being generated by amplifying the first power signal;
 a first impedance matching circuit provided between the second terminal and a first node; and
 a first signal path and a second signal path that provide signal transmission paths from the first terminal to the first node and are switchable in accordance with a power specification signal capable of setting power levels of the second power signal,
 wherein the first signal path includes:
 a plurality of stages of power amplification transistors including a first power amplification transistor as a last stage; and
 a plurality of impedance matching circuits including a second impedance matching circuit provided between an output node for the first power amplification transistor and the first node,
 wherein the second signal path includes:
 a plurality of stages of power amplification transistors including a second power amplification transistor as a last stage; and a plurality of impedance matching circuits including a third impedance matching circuit provided between an output node for the second power amplification transistor and the first node, wherein the number of stages of the power amplification transistors on the first signal path is equal to the number of stages of the power amplification transistors on the second signal path, and wherein the number of the impedance matching circuits on the first signal path is equal to the number of the impedance matching circuits on the second signal path.

2. The high-frequency power amplifier according to claim 1, further comprising:

a fourth impedance matching circuit provided between the first terminal and a second node; and fifth and sixth impedance matching circuits that use the second node as a common input, wherein the fourth and the fifth impedance matching circuits are included in the impedance matching circuits on the first signal path, and wherein the fourth and the sixth impedance matching circuits are included in the impedance matching circuits on the second signal path.

3. The high-frequency power amplifier according to claim 1, further comprising:

a third signal path that is formed from the first terminal to the first node and is switched in accordance with the power specification signal, wherein the third signal path includes:

a plurality of stages of power amplification transistors including a third power amplification transistor as a last stage; and a plurality of impedance matching circuits including a seventh impedance matching circuit provided between an output node for the third power amplification transistor and the first node, wherein the number of stages of the power amplification transistors on the third signal path is equal to the number of stages of the power amplification transistors on the first and the second signal paths, and wherein the number of the impedance matching circuits on the third signal path is equal to the number of the impedance matching circuits on the first and the second signal paths.

4. The high-frequency power amplifier according to claim 1, wherein the number of capacitor elements included in the impedance matching circuits on the first signal path is equal to the number of capacitor elements included in the impedance matching circuits on the second signal path, and wherein the number of inductor elements included in the impedance matching circuits on the first signal path is equal to the number of inductor elements included in the impedance matching circuits on the second signal path.

5. The high-frequency power amplifier according to claim 3, wherein the second impedance matching circuit is equivalent to a first capacitor element inserted between an output node for the first power amplification transistor and a power supply voltage node, wherein the third impedance matching circuit is equivalent to a second capacitor element inserted between an output node for the second power amplification transistor and a power supply voltage node, and wherein the seventh impedance matching circuit is equivalent to a third capacitor element inserted between an output node for the third power amplification transistor and the power supply voltage node.

6. The high-frequency power amplifier according to claim 5, wherein the third impedance matching circuit further includes a first switch inserted between the second capacitor element and the power supply voltage node, and wherein the seventh impedance matching circuit further includes a second switch inserted between the third capacitor element and the power supply voltage node.

7. The high-frequency power amplifier according to claim 3, wherein the high-frequency power amplifier is used for W-CDMA.

8. A high-frequency power amplifier comprising:

a first terminal where a first power signal is input;

a second terminal where a second power signal is output, the second power signal being generated by amplifying the first power signal;

a first power amplification transistor;

a second power amplification transistor sized smaller than the first power amplification transistor;

a third power amplification transistor sized smaller than the second power amplification transistor;

a first output impedance matching circuit provided between an output node for the first power amplification transistor and a first node;

a second output impedance matching circuit provided between an output node for the second power amplification transistor and the first node;

a third output impedance matching circuit provided between an output node for the third power amplification transistor and the first node;

a common output impedance matching circuit provided between the first node and the second terminal;

a fourth power amplification transistor provided prior to the first and the second power amplification transistors in common;

a first interstage impedance matching circuit provided between an output node for the fourth power amplification transistor and an input node for the first power amplification transistor;

a second interstage impedance matching circuit provided between an output node for the fourth power amplification transistor and an input node for the second power amplification transistor;

a fifth power amplification transistor that is provided prior to the third power amplification transistor and is sized smaller than the fourth power amplification transistor;

a third interstage impedance matching circuit provided between an output node for the fifth power amplification transistor and an input node for the third power amplification transistor;

a common input impedance matching circuit provided between the first terminal and the second node;

a first input impedance matching circuit provided between the second node and an input node for the fourth power amplification transistor;

a second input impedance matching circuit provided between the second node and an input node for the fifth power amplification transistor; and a control circuit that provides control to activate one of the first through the third power amplification transistors and one of the fourth and the fifth power amplification transistors and inactivate the remaining power amplification transistors in accordance with a power specification signal for configuring a power level of the second power signal.

9. The high-frequency power amplifier according to claim 8,
wherein the first output impedance matching circuit is equivalent to a first capacitor element that is inserted in series between an output node for the first power amplification transistor and a power supply voltage node,
wherein the second output impedance matching circuit is equivalent to a second capacitor element that has a larger capacitance value than the first capacitor element and is inserted in series between an output node for the second power amplification transistor and the power supply voltage node, and
wherein the third output impedance matching circuit is equivalent to a third capacitor element that has a larger capacitance value than the second capacitor element and is inserted in series between an output node for the third power amplification transistor and the power supply voltage node.

10. The high-frequency power amplifier according to claim 9,
wherein the first input impedance matching circuit is equivalent to a fourth capacitor element inserted in series between the second node and an input node for the fourth power amplification transistor, and
wherein the second input impedance matching circuit is equivalent to a fifth capacitor element inserted in series between the second node and an input node for the fifth power amplification transistor.

11. The high-frequency power amplifier according to claim 10,
wherein the second output impedance matching circuit further includes a first switch inserted in series between the second capacitor element and the power supply voltage node, and
wherein the third output impedance matching circuit further includes a second switch inserted in series between the third capacitor element and the power supply voltage node.

12. The high-frequency power amplifier according to claim 8,
wherein the high-frequency power amplifier is used for W-CDMA.

13. A high-frequency power amplifier comprising:
a first terminal where a first power signal is input;
a second terminal where a second power signal is output, the second power signal being generated by amplifying the first power signal;
a first power amplification transistor;
a second power amplification transistor sized smaller than the first power amplification transistor;
a first output impedance matching circuit provided between an output node for the first power amplification transistor and a first node;
a second output impedance matching circuit provided between an output node for the second power amplification transistor and the first node;
a common output impedance matching circuit provided between the first node and the second terminal;
a third power amplification transistor provided prior to the first power amplification transistor;
a first interstage impedance matching circuit provided between an output node for the third power amplification transistor and an input node for the first power amplification transistor;
a fourth power amplification transistor that is provided prior to the second power amplification transistor and is sized smaller than the third power amplification transistor;
a second interstage impedance matching circuit provided between an output node for the fourth power amplification transistor and an input node for the second power amplification transistor;
a common input impedance matching circuit provided between the first terminal and the second node;
a first input impedance matching circuit provided between the second node and an input node for the third power amplification transistor;
a second input impedance matching circuit provided between the second node and an input node for the fourth power amplification transistor;
a control circuit that provides control to put the first through the fourth power amplification transistors into one of active state and inactive state in accordance with a power specification signal for configuring a power level of the second power signal,
wherein the first power amplification transistor is configured by coupling in parallel a first-A power amplification transistor and a first-B power amplification transistor,
wherein the third power amplification transistor is configured by coupling in parallel a third-A power amplification transistor and a third-B power amplification transistor,
wherein the control circuit, in accordance with the power specification signal, provides control to put the first-A, the first-B, and the second power amplification transistors into one of sets of "active state, active state, and inactive state," "active state, inactive state, and inactive state," and "inactive state, inactive state, and active state," respectively, and to put the third-A, the third-B, and the fourth power amplification transistors into one of sets of "active state, active state, and inactive state," "active state, inactive state, and inactive state," and "inactive state, inactive state, and active state," respectively.

14. The high-frequency power amplifier according to claim 13,
wherein the first output impedance matching circuit is equivalent to a first capacitor element that is inserted in series between an output node for the first power amplification transistor and a power supply voltage node, and
wherein the second output impedance matching circuit is equivalent to a second capacitor element that has a larger capacitance value than the first capacitor element and is inserted in series between an output node for the second power amplification transistor and the power supply voltage node.

15. The high-frequency power amplifier according to claim 14,
wherein the first input impedance matching circuit is equivalent to a third capacitor element inserted in series between the second node and an input node for the third power amplification transistor, and
wherein the second input impedance matching circuit is equivalent to a fourth capacitor element inserted in series between the second node and an input node for the fourth power amplification transistor.

16. The high-frequency power amplifier according to claim 15,
    wherein the second output impedance matching circuit further includes a first switch inserted in series between the second capacitor element and the power supply voltage node.

17. The high-frequency power amplifier according to claim 13,
    wherein the high-frequency power amplifier is used for W-CDMA.

* * * * *